(12) United States Patent
Davis et al.

(10) Patent No.: US 6,685,799 B2
(45) Date of Patent: Feb. 3, 2004

(54) VARIABLE EFFICIENCY FARADAY SHIELD

(75) Inventors: Matthew F. Davis, Brookdale, CA (US); Frank Hooshdaran, Pleasanton, CA (US)

(73) Assignee: Applied Materials Inc., Santa Clara, CA (US)

( * ) Notice: Subject to any disclaimer, the term of this patent is extended or adjusted under 35 U.S.C. 154(b) by 52 days.

(21) Appl. No.: 09/808,649

(22) Filed: Mar. 14, 2001

(65) Prior Publication Data

US 2002/0129903 A1 Sep. 19, 2002

(51) Int. Cl.$^7$ .............................. C23C 16/00; C23F 1/00
(52) U.S. Cl. ................................ 156/345.48; 118/723 I
(58) Field of Search ................. 118/723 I, 723 IR, 118/723 AN, 723 R; 156/345, 345.48, 345.49; 315/111.51; 204/298.06, 298.34

(56) References Cited

U.S. PATENT DOCUMENTS

| 4,238,733 A | * | 12/1980 | Freeman | 324/772 |
| 4,860,756 A | * | 8/1989 | Ko et al. | 600/409 |
| 5,234,529 A | | 8/1993 | Johnson | |
| 5,650,032 A | * | 7/1997 | Keller et al. | 156/345.48 |
| 5,811,022 A | * | 9/1998 | Savas et al. | 118/723 I |
| 6,056,848 A | * | 5/2000 | Daviet | 118/723 I |
| 6,071,372 A | | 6/2000 | Ye et al. | |
| 6,379,576 B2 | * | 4/2002 | Luo et al. | 118/723 E |
| 6,422,173 B1 | | 7/2002 | Nakajima | |

FOREIGN PATENT DOCUMENTS

WO     WO 01/13403 A1 * 2/2001

* cited by examiner

*Primary Examiner*—Luz Alejandro
(74) *Attorney, Agent, or Firm*—Roberts, Abokhair, Mardula; Joseph Bach (57) ABSTRACT

A Faraday shield for use with a plasma reactor has a variable shielding efficiency. The shield is divided into numerous shield segments that may each be selectively grounded or ungrounded. The rate of transition between fully ungrounded and fully grounded states is controllable so as to maintain stable plasma conditions in the plasma reactor during the transitional period. The time rate of change of the shielding efficiency can be controlled at a predetermined rate once plasma strike is achieved, or can be made conditional to successful matching at the previous shield setting. When the Faraday shield is fully grounded, the amount of on-wafer and on-chamber contamination is reduced by reducing the rate of sputtering of chamber surfaces.

8 Claims, 11 Drawing Sheets

VARIABLE EFFICIENCY FARADAY SHIELD

BACKGROUND OF THE INVENTION

The present invention relates generally to the field of electrical shielding. More particularly, the present invention relates to a Faraday shield for use with a plasma chamber.

Faraday shields have been used in plasma chambers to reduce capacitive RF coupling, which can result in ion erosion of chamber surfaces. A broad range of chamber materials is susceptible to this ion erosion problem: ceramic, quartz, SiN, SiC, plastics, etc. The Faraday shield is placed between RF antenna coils and the plasma containment chamber and reduces the amount of ion erosion of the chamber that is caused by RF electric field induced ion bombardment. The shield may be either grounded or floating.

A grounded shield design has the down side of making it very difficult to strike a plasma discharge in the chamber because reducing the capacitive coupling also reduces the magnitude of the RF electric field strength. However the grounded shield is effective for reducing ion erosion of the chamber. A floating shield design has the advantage that it does not interfere unduly with striking a plasma. Unfortunately, the floating shield is not very effective at preventing ion erosion of the chamber.

Figure 1:
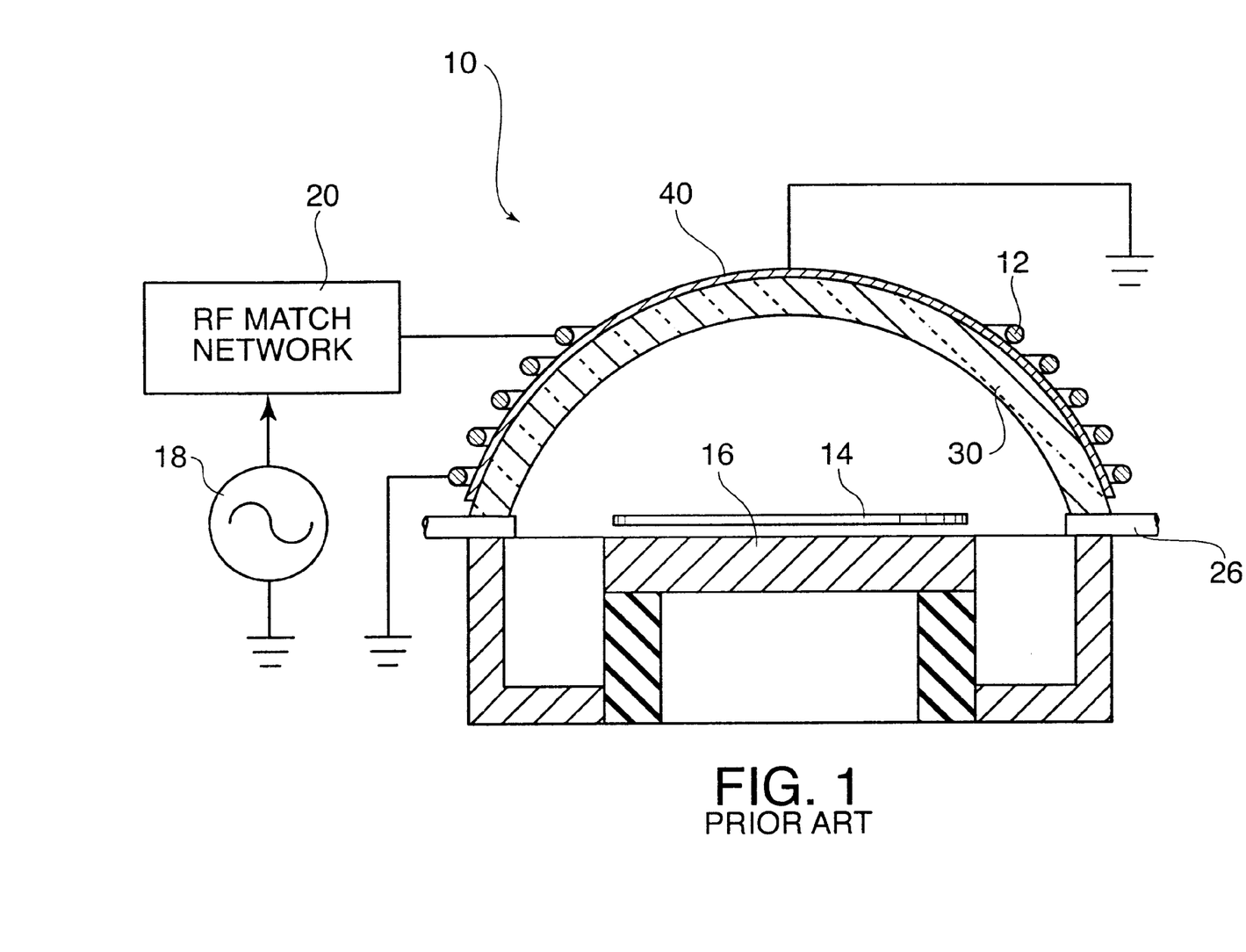
FIG. 1 illustrates a cross sectional schematic view of a plasma reactor according to the prior art, having a fully grounded Faraday shield.

Referring to FIG. 1, an inductively coupled plasma etch reactor implementing a grounded Faraday shield 40 according to the prior art is illustrated. This reactor has a vacuum chamber 10 surrounded by an inductive coil 12. A workpiece 14, usually a semiconductor wafer, is supported inside the chamber 10 on a pedestal 16. An inductive coil antenna 12 is wound around the outside of the chamber 10 and connected to a radio frequency (RF) power generator 18 through an impedance matching network 20 to provide RF power into the chamber. The chamber walls 30 in proximity to the antenna coil are composed of an electrically insulating material, typically quartz or ceramic, so as to minimize attenuation of the RF power coupled into the chamber 10. Etchant gas is introduced into the chamber 10 through gas injection ports 26. A vacuum pump (not shown) evacuates the chamber 10 to a desired chamber pressure.

The chamber dome 30 functions as an RF aperture. The Faraday shield 40 is effective at reducing process induced sputtering of the chamber dome 30. The Faraday shield 40 is connected to ground potential and is, thus, fully grounded.

Figure 2:
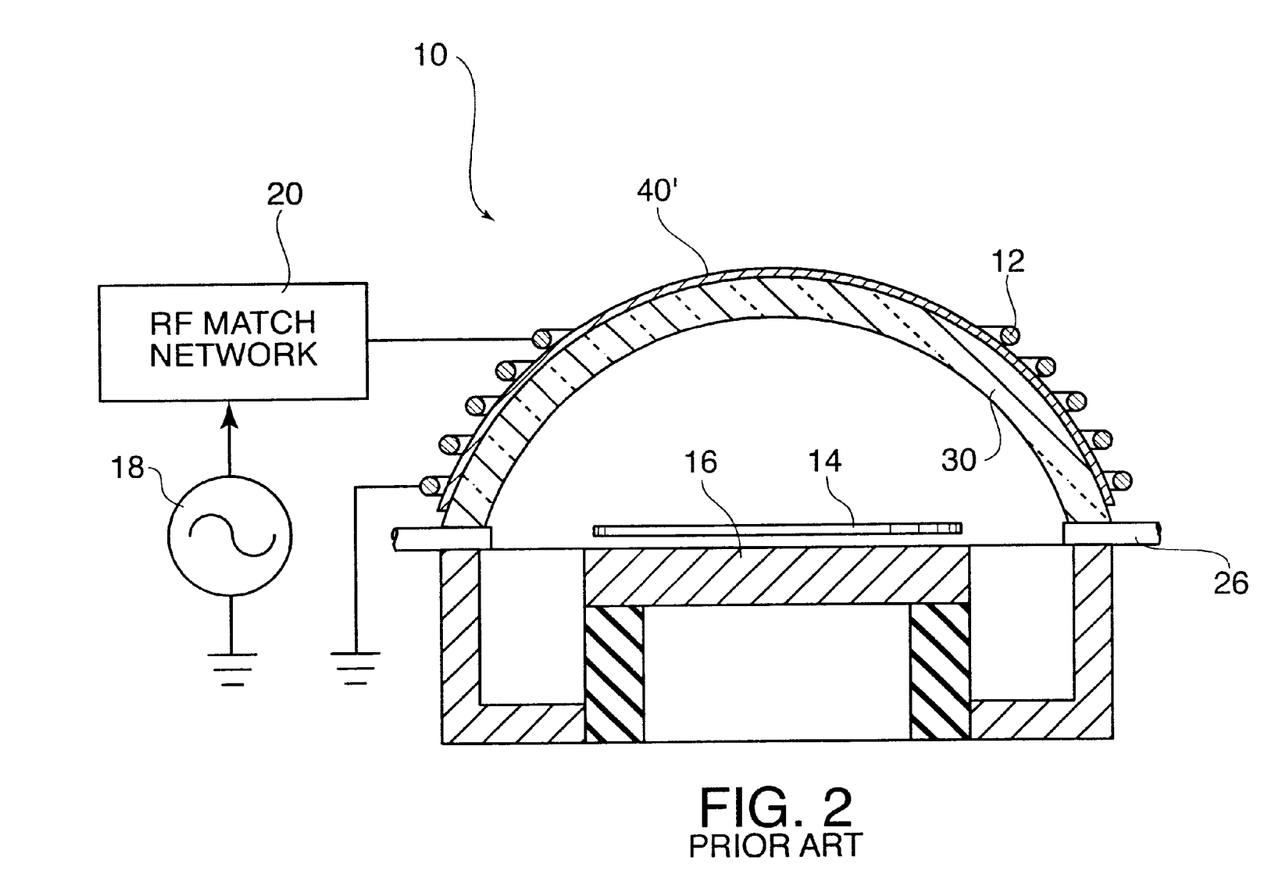
FIG. 2 illustrates a cross sectional schematic view of a plasma reactor according to the prior art, having an ungrounded Faraday shield.

Referring to FIG. 2, an inductively coupled plasma etch reactor implementing a floating Faraday shield 40' according to the prior art is illustrated. The floating (or "isolated") Faraday shield 40' is a known alternative to the fully grounded embodiment of FIG. 1. This approach is in widespread use on plasma chambers. Its performance is limited in comparison to what is achievable with a grounded design however.

These prior art Faraday shields 40, 40' reduce parasitic capacitive coupling between the antenna coils of inductively coupled plasma (ICP) sources and the contained plasma. The prior art shields are of a fixed efficiency design however.

Thus, what is needed is a Faraday shield that provides the efficiency of a fully grounded configuration, but that will not create the arc attenuation of a fully grounded configuration.

According to prior art nomenclature, the Faraday shield structures used in conjunction with a processing chamber have been referred to as a "voltage distribution electrode" (or VDE). However, because of significant structural distinctions, it may not be appropriate to use this older terminology for describing at least some embodiments according to the present invention.

SUMMARY OF THE INVENTION

One aspect of the present invention is reduction of the intensity of damaging ion-bombardment for certain semiconductor processing chamber surfaces, without affecting plasma striking capability.

Another aspect of the present invention is to provide a Faraday shield having a variable shielding efficiency.

Yet another aspect of the present invention is to control the rate of transition of a Faraday shield between fully ungrounded and fully grounded states.

Still another aspect of the present invention is to control the rate of transition of a Faraday shield of a plasma reactor between a fully ungrounded state and a fully grounded state so as to maintain stable plasma conditions in the transitional period.

A further aspect of the present invention is to control the time rate of change of the change in shielding efficiency of a Faraday shield at a predetermined rate.

An additional aspect of the present invention is to control the time rate of change of change of shielding efficiency of a Faraday shield of a plasma reactor conditioned upon successful matching as the shield efficiency settings change.

Another aspect of the present invention is to provide a variable efficiency Faraday shield having radial symmetry with pie shaped shield segments.

Some of the above aspects are embodied by a shield that provides electrical shielding at a variable efficiency. The shield includes a substrate, a common node disposed on the substrate, and plural shield segments spaced apart from one another and being disposed on the substrate. The shield also includes plural switches, wherein each of the plural switches is connected between the common node and a respective one of the plural shield segments, so that closure of the switch connects its respective one of the plural shield segments to the common node.

Others of the above aspects are embodied by a shielding system that provides electrical shielding at a variable efficiency. The shield includes a substrate, a common node disposed on the substrate, and plural shield segments spaced apart from one another and being disposed on the substrate. The shield also includes plural switches, wherein each of the plural switches is connected between the common node and a respective one of the plural shield segments, so that closure of the switch connects its respective one of the plural shield segments to the common node. The control interface includes a ground circuit connecting the common node to ground potential, and an incremental command circuit connected to each of the plural switches and generating command signals to selectively close the plural switches based upon occurrence of one or more conditions precedent.

Certain of the above aspects are embodied by a plasma reactor which is useful in applying energized plasma to semiconductor articles. The plasma reactor includes a reactor body (where at least a portion of the reactor body is formed of a dielectric material), an RF antenna disposed adjacent the reactor body, an RF matching network connected to the RF antenna to couple energy to the RF antenna, and a shield having variable shielding efficiency, disposed between the RF antenna and the reactor body. A semiconductor article disposed in the reactor body is processed by plasma that is energized by the RF antenna.

Some of the above aspects are embodied by a method of shielding. The shielding method includes providing a shield having a variable shielding efficiency, setting the shielding efficiency at a minimum value, and incrementally increasing the shielding efficiency of the shield.

Some of the above aspects are also embodied by a method of etching a semiconductor article. This method includes placing the semiconductor article in a plasma etch chamber and setting the shielding efficiency of a shield to a minimum value. A plasma is struck about the semiconductor article, and the shielding efficiency of the shield is then increased from the minimum value to a maximum value.

Another way of embodying some of the above aspects is a method of retrofitting a variable efficiency electrical shield to a semiconductor process chamber surrounded by an RF antenna. This method includes providing a variable efficiency electrical shield, installing the shield between the process chamber and the RF antenna, and interfacing the shield to a process controller to establish control of the efficiency of the shield.

Also according to the various embodiments of the present invention, the rate of transition between fully ungrounded and fully grounded states is controllable so as to maintain stable plasma conditions in the transitional period. With this novel approach, the time rate of change of the shielding efficiency is controlled at a predetermined rate once plasma strike is achieved, or is made conditional to successful matching at the previous shield setting.

BRIEF DESCRIPTION OF THE DRAWINGS

Additional objects and advantages of the present invention will be apparent in the following detailed description read in conjunction with the accompanying drawing figures.

DETAILED DESCRIPTION OF THE INVENTION

An ungrounded passive voltage distribution electrode (VDE) is commonly interposed between the excitation antenna coils and the RF dome in an etch chamber. This VDE is an example of an application-specific ungrounded Faraday shield.

As discussed above, a grounded shield is more effective at minimizing the capacitive coupling between the excitation antennae and the chamber plasma, and therefore in reducing the plasma potential difference between the bulk of the plasma and the inner surface of the RF aperture. By reducing the plasma potential in this location, the sputter erosion rate of the ceramic material of the aperture is significantly reduced.

Unfortunately, a grounded shield design has the downside of making plasma strike difficult in the chamber, and can cause the impedance of the aggregate antenna circuit fall outside of the nominal range of the tuning network. This is the principal reason why the more effective grounded design has not been incorporated into prior art plasma chamber designs.

The present invention obtains the functionality of both the ungrounded and the grounded prior art shield configurations, without an abrupt change between the two.

A shield according to an embodiment of the present invention is situated between the RF antennae of an Inductively Coupled Plasma (ICP) source and the RF aperture of an inductively coupled semiconductor processing chamber. The invention has a compact design, and can be added to a pre-existing chamber without the need for extensive mechanical or RF redesign. According to a preferred embodiment of the present invention, a shield apparatus is constructed that has a Faraday shield design which is divided into numerous independent "pie slice" segments, each switchable to ground potential.

According to one aspect of the present invention, the rate at which the shield segments are grounded can be precisely controlled, so that the ungrounded-to-grounded transition occurs at a rate at which existing RF matching network can track and maintain optimal power coupling into the plasma. Another aspect of the present invention is that the Faraday shield apparatus includes structure for shielding of critical control and switching elements to allow the Faraday shield to operate reliably in an RF hot environment.

A very useful aspect of the present invention is that the rate of increase of the shielding efficiency is an adjustable parameter. Thus, the rate of change of shield efficiency is adaptable so as to match the finite match tuning rates for a given plasma chamber.

Figure 3:
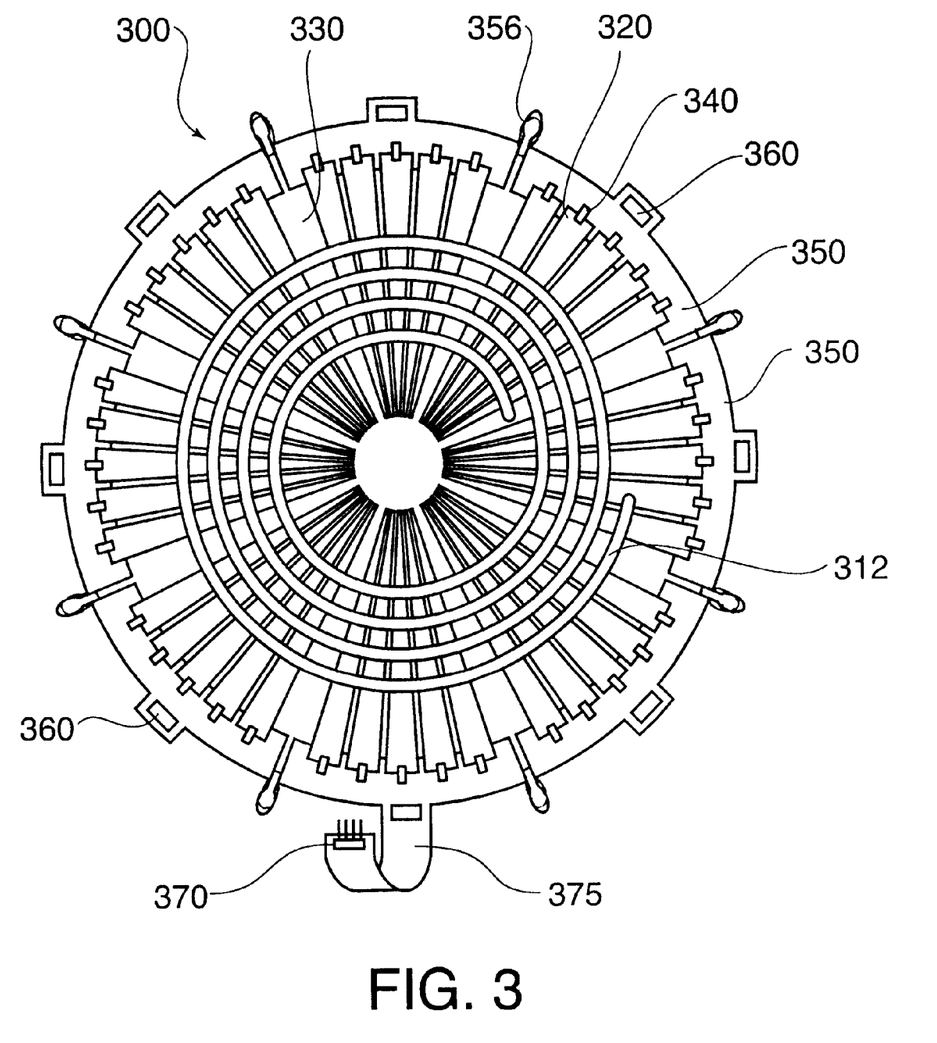
FIG. 3 illustrates plan view of a variable efficiency Faraday shield according to an embodiment of the present invention, situated between an RF antenna and a domed of a plasma chamber.

Referring to FIG. 3, a plan view of a variable efficiency Faraday shield 300 according to an embodiment of the present invention is illustrated. The Faraday shield 300 is situated between an RF antenna 312 and a dome 330 of a plasma chamber.

The Faraday shield 300 is divided into numerous independent "pie slice" shaped segments 320. Each of the shield segments 320 is switchable to ground potential via a corresponding switch 340. The switch 340 selectably connects its respective shield segment 320 to a grounded circuit on a flexible circumferential segment 350. Because of the switchability, the shield 300 is actively adjustable rather than being a passive device with a single transfer characteristic.

The individual shield segments 320 and the circumferential segment 350 are formed using flexible circuit technology, and the switching 340 and control electronics 360 are surface mounted directly to the circumferential segment 350 structure. The grounded circuit on the circumferential segment 350 is preferably structured to incorporate grounded elements (not shown) that provide a high degree of RF noise isolation to the control electronics 360 that drive the switching electronics 340 and to the control signal input lines. It is also preferred that the shield segments 320 and the circumferential segment 350 share a common flexible substrate.

Figure 4:
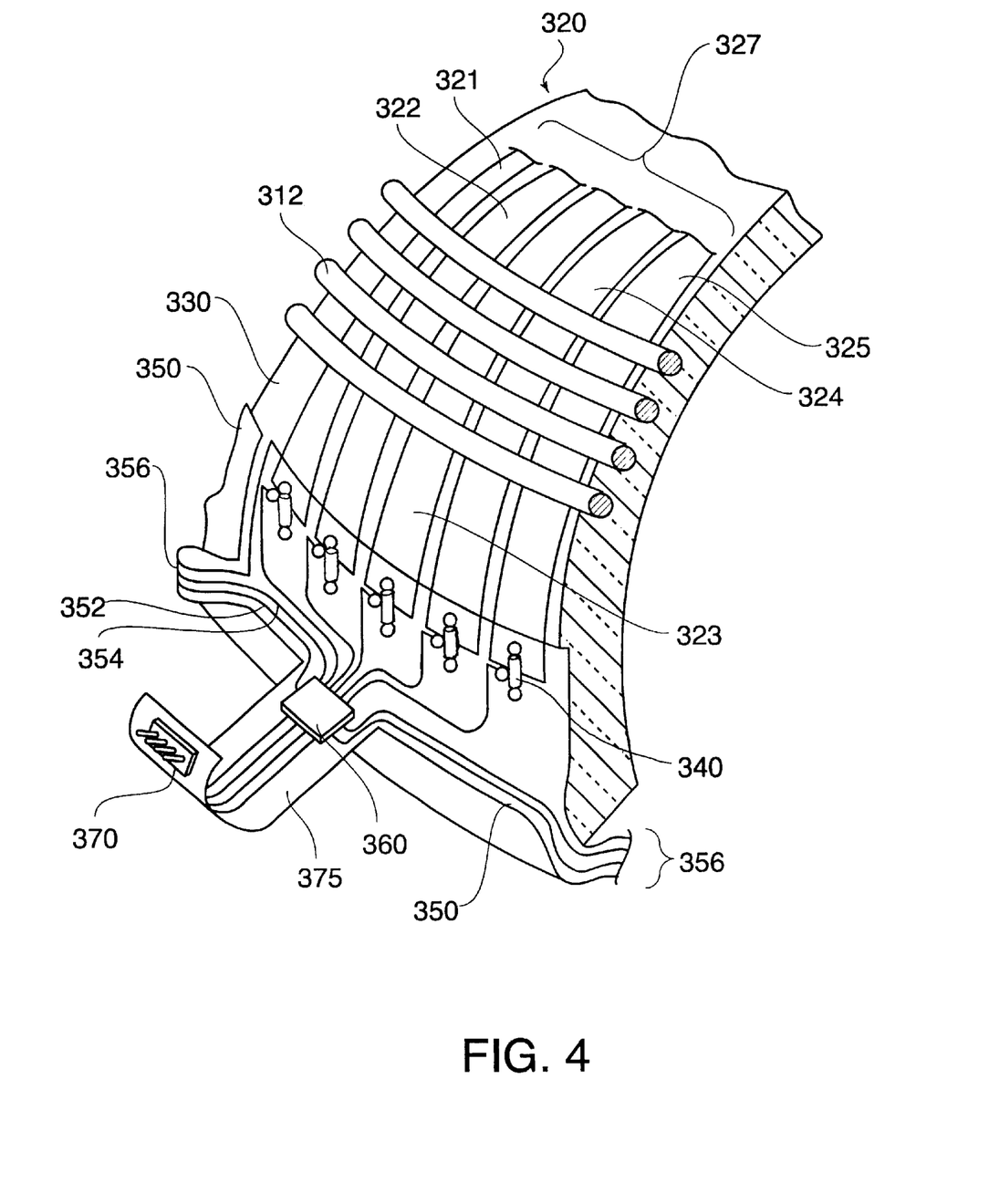
FIG. 4 illustrates a perspective detail view of a portion of a variable efficiency Faraday shield according to the embodiment of FIG. 3.

Referring to FIG. 4, a perspective detail view of a portion of the variable efficiency Faraday shield 300 according to the embodiment of FIG. 3 is illustrated. According to this embodiment, sets of segments are grouped, or activated simultaneously, to reduce the total number of addressable shielding levels to a manageable number. This embodiment has five groupings 321, 322, 323, 324, 325 of electrode segments 320 so as to give selectable shielding at six levels, i.e., 0, 20, 40, 60, 80 and 100% of the maximum value. The members of each grouped set 321, 322, 323, 324, 325 of co-activated segments are radially distributed so that they form eight (in this embodiment) platoons 327 that consist of one segment from each set 321, 322, 323, 324, 325.

According to an alternate embodiment, the switch 340 corresponding to each and every single shield segment is independently addressable so that each shield segment 320 is independently switchable. This provides for much finer resolution of shield efficiently variation and produces the maximum operational flexibility. On the other hand, this maximizes the complexity of addressing the switches 340.

Interconnections 352, 354 between the switch control electronics elements 360 run circumferentially and are collected at a single interfacing connector 370, which interfaces to the system controller (not shown in this view).

An optional feature of the Faraday shield are the thinned portions 356 of the circumferential segment 350. The thinned portions 356 provide adaptability of size and shape so that a single Faraday shield configuration is useable for chamber lids and domes having a range of diverse sizes and shapes. The thinned portions 356 need only be wide enough to bear the grounding lines and the signal lines 352, 354 running between all the driver circuits 360.

The driver circuits 360 are exemplified as five channel multiplexed driver chips. The type of driver chip is based on the type of device that is used to embody the switches 340. When PIN diodes are chosen for switches 340, a suitable choice for the driver circuits 360 is a Decoded PIN Driver sold under the designation "DS Series" by Impellimax of 375 West Hollis Street, Nashua, N.H. 03060.

Figure 5:
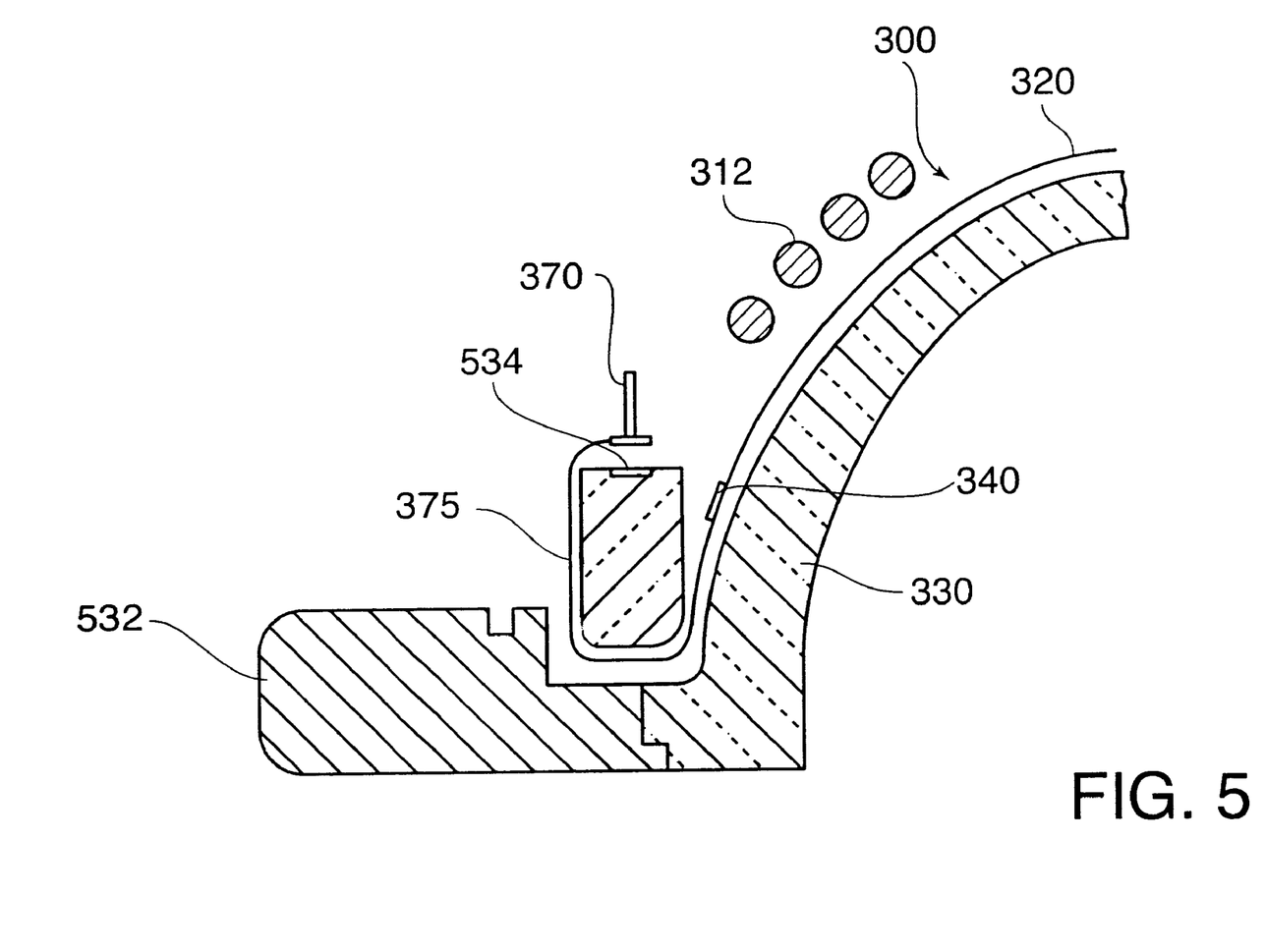
FIG. 5 illustrates a cross sectional detail view of a variable efficiency Faraday shield according to the embodiment of FIG. 3, situated with respect to various hardware of a plasma chamber.

Referring to FIG. 5, a cross sectional detail view of a variable efficiency Faraday shield 300 according to the embodiment of FIG. 3 is illustrated. The Faraday shield 300 is shown situated with respect to various hardware of a plasma chamber. The shield segments 320 of the Faraday shield 300 are disposed between the antenna coil 312 and the dome 330.

A clamp ring 532 engages the dome 330 circumferentially. A TEFLON™ ring 534 rests on the clamp ring 532 and the edge of the dome 330 to hold the flexible Faraday shield 300 in place about its circumference. The interfacing connector 370 is coupled via a flat flexible interface cable 375, which wraps under and around the TEFLON™ ring 534 and connects to the circuitry of the Faraday shield 300.

One aspect of the present invention is that each segment 320 of the shield 300 is connected to the grounded circuit on the circumferential segment 350 through a switch 340. The switch 340 may be embodied as a switchable PIN diode, and may alternately be embodied as an equivalent device. Each of these switches 340 is controlled by driver circuitry 360. When the switches 340 are embodied as PIN diodes, the driver circuitry 360 is preferably a PIN diode driver chip.

Figure 6:
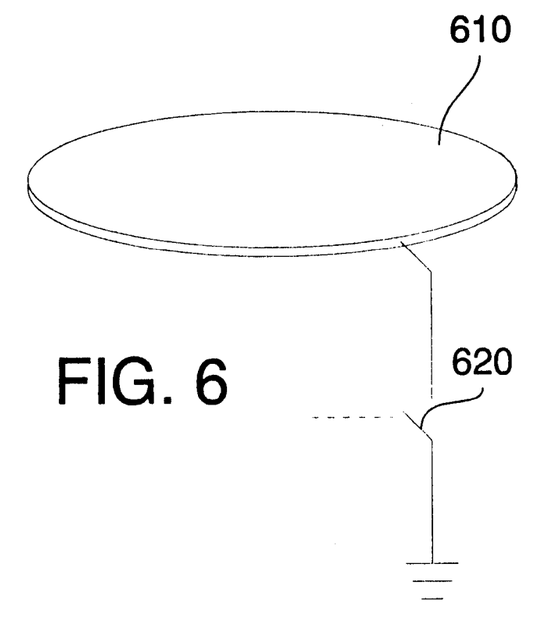
FIG. 6 illustrates a schematic view of a simplified variable efficiency Faraday shield according to an alternate embodiment of the present invention.

Referring to FIG. 6, a schematic view of a simplified variable efficiency Faraday shield 610 according to an alternate embodiment of the present invention is illustrated. The efficiency of a single plate Faraday shield 610 is made variable by coupling the shield to ground via a switch 620 that enables the shield to be selectively connected to or disconnected from ground potential.

When this shield structure is employed, a plasma arc is struck when the Faraday shield 610 is switched to its floating state. Then the switch 620 is closed to ground the Faraday shield 610 once a stable plasma has been established.

Under certain circumstances, this shield configuration provides a satisfactory solution to the plasma strike vs. dome etch dilemma of the prior art. That is because it is possible, albeit difficult for some geometries, to maintain the plasma when the shield is switched from a floating state to a fully grounded state. When the shield is switched from a floating state to a grounded state, this substantially changes the electrical impedance seen at the RF antenna (not shown in this view). The RF match network (not shown in this view) must adapt quickly enough to the sudden change in impedance to prevent power transfer efficiency dropping too much. This embodiment is not preferred in some circumstances, though, because potential instability in power transfer may tend to destabilize and extinguish the plasma.

Figure 7:
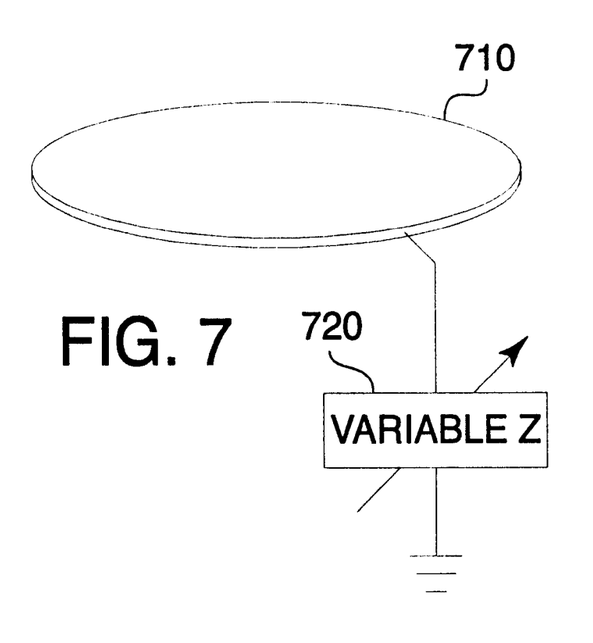
FIG. 7 illustrates a schematic view of a variable efficiency Faraday shield according to another alternate embodiment of the present invention.

Referring to FIG. 7, a schematic view of a variable efficiency Faraday shield 710 according to another alternate embodiment of the present invention is illustrated. The efficiency of a single plate Faraday shield 710 is made variable by coupling the shield 710 to ground via a variable impedance element 720. The variable impedance element 720 may take on an impedance value Z that has either a capacitive or inductive component at the RF excitation frequency, or that is purely resistive. The magnitude of the impedance value Z of the variable impedance element 720 may be varied from a maximum value all the way down to zero (i.e., a short circuit).

When the shield structure according to this embodiment is employed, a plasma arc is struck when the Faraday shield 710 is in a high impedance state, being essentially floated by having the impedance value Z of the variable impedance element 720 set at a high magnitude. Once a stable plasma has been established, the impedance value Z is gradually reduced in magnitude.

Implementation of a Faraday shield combined with an impedance structure according to this embodiment would be effected in a configuration similar to that of the embodiment of FIG. 4, with one or more impedance elements substituted in place of the switches 340.

Figure 8:
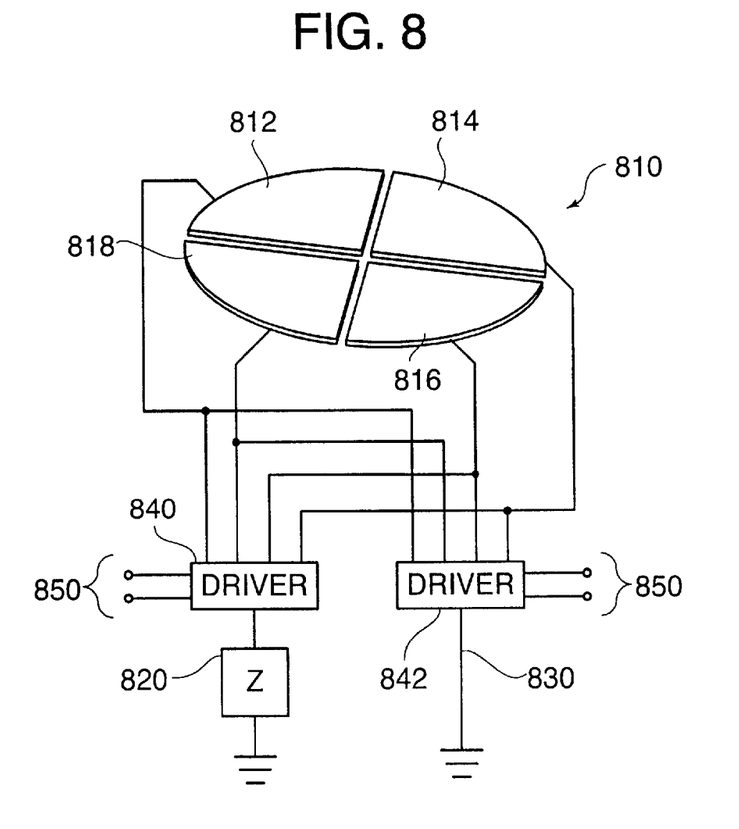
FIG. 8 illustrates a schematic view of a variable efficiency Faraday shield according to yet another alternate embodiment of the present invention.

Referring to FIG. 8, a schematic view of a variable efficiency Faraday shield 810 according to yet another alternate embodiment of the present invention is illustrated. The efficiency of a multiple segment Faraday shield 810 is made variable by permitting any or all of the shield segments 812, 814, 816, 818 to float, and selectively coupling any or all of the shield segments 812, 814, 816, 818 to ground via an impedance element 820 (having an impedance Z) or a direct connection 830. Switching for selective connection of the shield segments to either the impedance element or directly to ground is effected by tandem driver circuits 840, 842. The tandem driver circuits 840, 842 are controlled by control lines 850 to select which shield segments 812, 814, 816, 818 are to float, which are to connect to ground via the impedance element, and which are to connect to ground directly. Any connection combination is possible utilizing the circuit configuration illustrated, thus enabling choice of a myriad of possible shielding efficiencies. The number of shield segments shown is merely illustrative and is not intended to be limiting.

Figure 9:
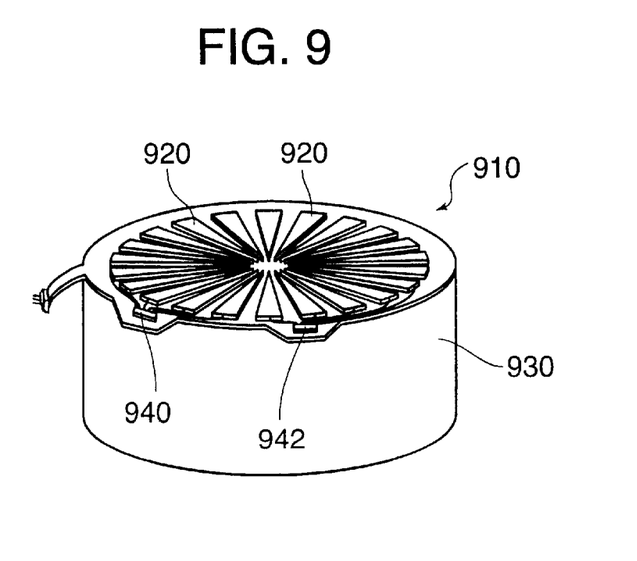
FIG. 9 illustrates a perspective view of a variable efficiency Faraday shield according to still another alternate embodiment of the present invention.

Referring to FIG. 9, a perspective view of a variable efficiency Faraday shield 910 according to an alternate embodiment of the present invention is illustrated. The shield 910 has plural segments 920 that are disposed across the top of a flat top chamber 930. The segments 920 are selectably switchable from floating state to ground state by driver circuits 940, 942. Application of the present invention is certainly not limited to domed chambers, nor to shield configurations having radial symmetry.

Figure 10:
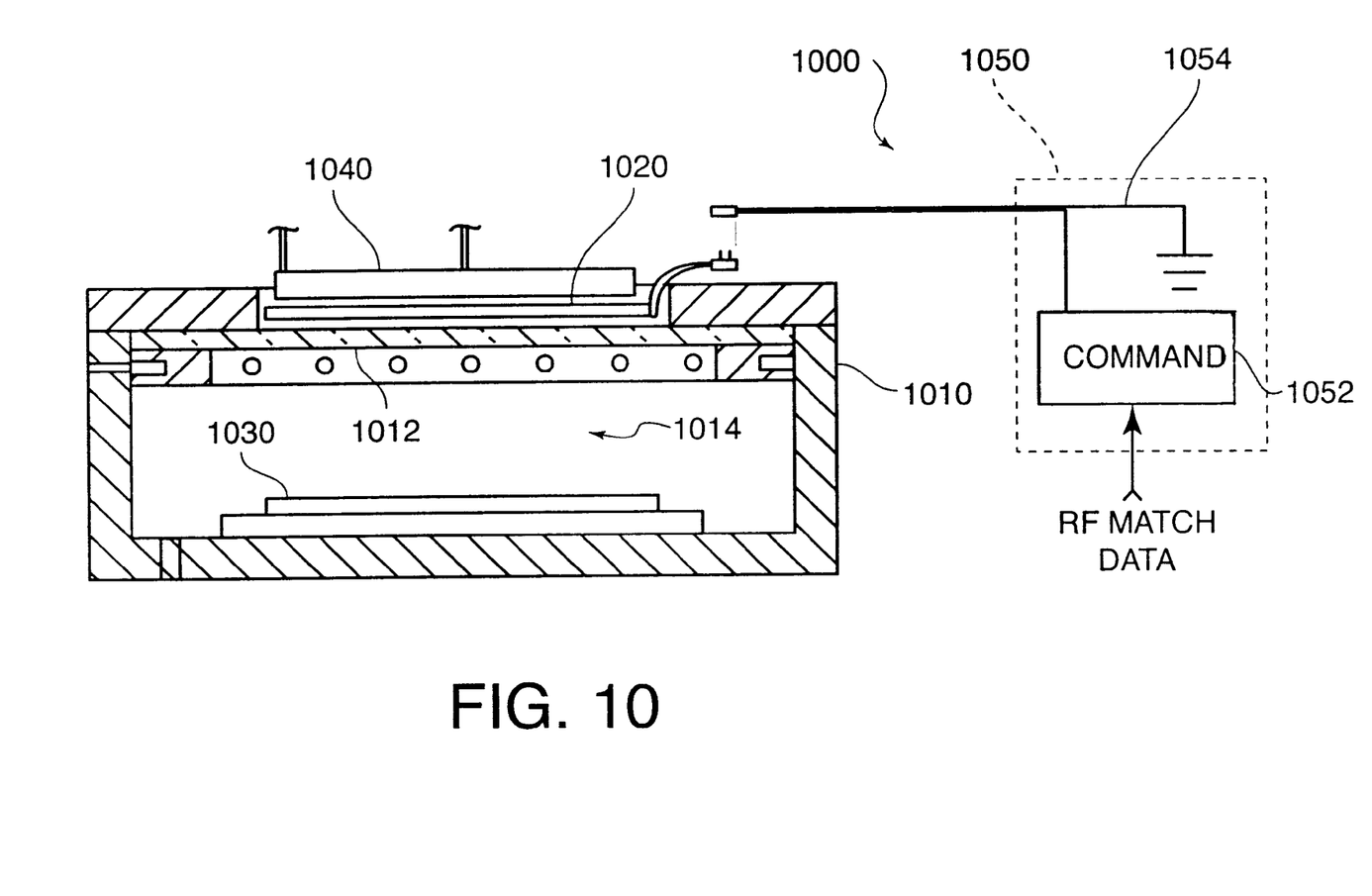
FIG. 10 illustrates a sectional view of a processing chamber with a flat top.

Referring to FIG. 10, a sectional view of a processing chamber 1010 with a flat top is illustrated. A variable efficiency Faraday shield 1020 is disposed above the dielectric shield 1012. A plasma is formed in the space 1014 above wafer 1030 to be processed. The plasma is energized by the RF antenna 1040 disposed above the variable efficiency Faraday shield 1020.

Also illustrated via a block diagram portion of FIG. 10 is how the variable efficiency Faraday shield 1020 is integrated into a shielding system 1000. The shield 1020 is connected to a control interface 1050 that provides grounding and command signals. Switches in the shield 1020 are controlled by command signals received from an incremental command circuit 1052. The command signals are issued based on conditions precedent, such as the passage of time or an indication of an RF match by an RF match network. As the switches in the shield 1020 are closed, segments of the shield 1020 are connected to a ground circuit 1054.

Figure 11:
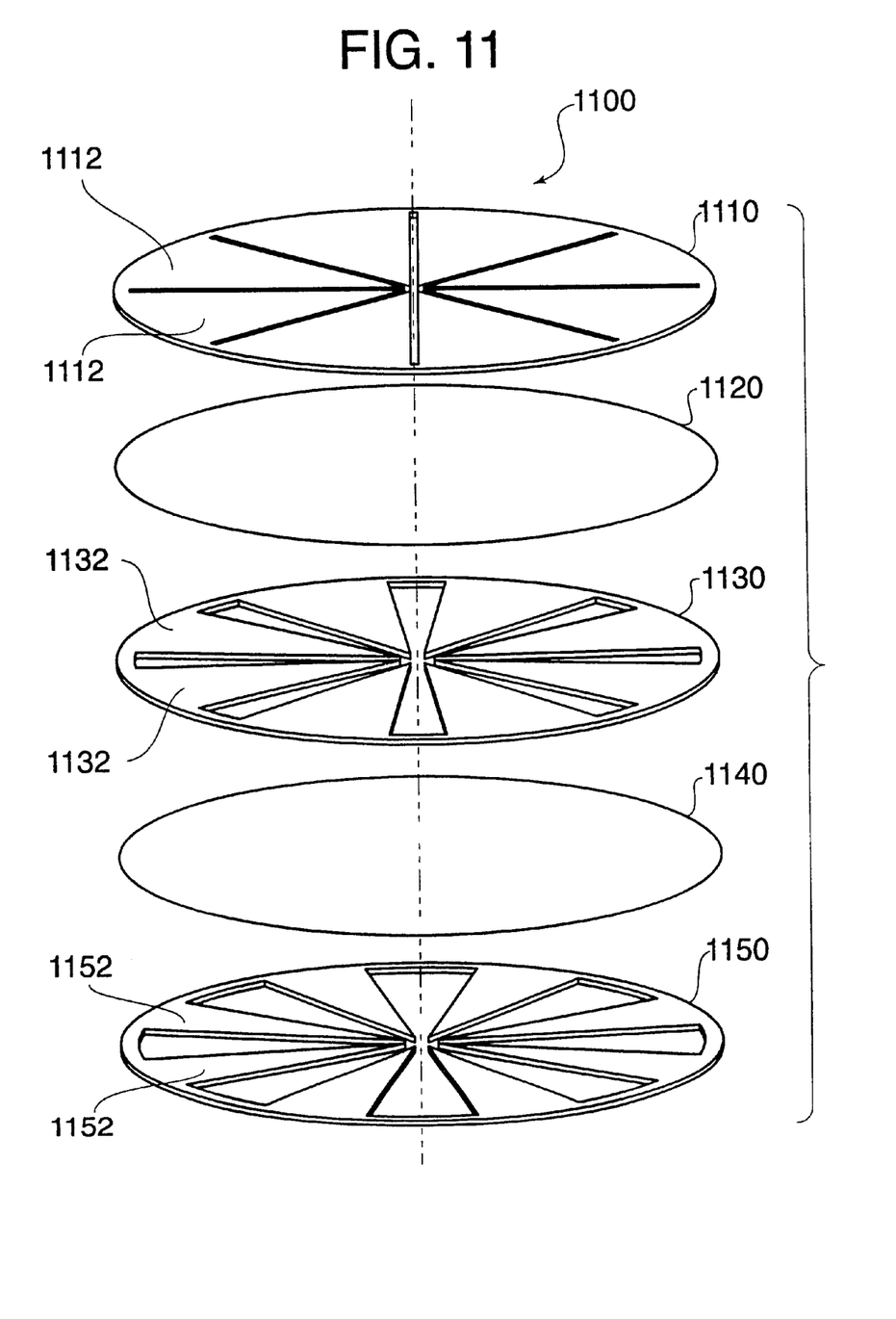
FIG. 11 illustrates an exploded view of a variable efficiency Faraday shield according to a further alternate embodiment of the present invention.

Referring to FIG. 11, an exploded view of a variable efficiency Faraday shield 1100 according to a further alternate embodiment of the present invention is illustrated. A shield according to this embodiment has multiple shield segments 1110, 1130, 1150 layered on top of one another, the separate layers of conductive shield segments 1110, 1130, 1150 being isolated from one another by non-conductive layers 1120, 1140. Each of the shield segments 1110, 1130, 1150 is independently, selectably connectable to ground, either directly or via an impedance element. In practice the shield segments 1110, 1130, 1150 and the non-conductive layers 1120, 1140 are sandwiched together rather than being spaced apart as shown in this exploded view. Circuitry for selectably connecting the shield segments to ground is not shown, but is preferably implemented as described elsewhere in this description, in regard to other embodiments. When the lowest shield efficiency is desired, all of the shield segments 1110, 1130, 1150 are disconnected so that they float.

The bottom shield segment 1150 has narrow spoke-shaped radial members 1152 in a configuration having radial symmetry. When it is desired to increment the efficiency of the shield 1100 above the lowest level, the bottom segment 1150 alone is connected to ground with the remaining segments 1110, 1130 left floating.

The middle shield segment 1130 has radial members 1132 of an intermediate width in a configuration having radial symmetry. The radial members 1132 of the middle layer 1130 preferably overlap those of the bottom layer 1150. Grounding the middle shield segment 1130 further increases the shielding efficiency of the shield 1100.

The uppermost shield segment 1110 has wide pie slice-shaped radial members 1112 in a configuration having radial symmetry. The radial members 1112 of the uppermost layer 1110 preferably overlap those of the middle and bottom layers 1130, 1150. Grounding the uppermost shield segment 1110 increases the shielding efficiency of the shield 1100 to a maximum level.

Although this embodiment of the shield 1100 has been illustrated as having three layered segments, the shield is optionally implemented with only two layers to increase simplicity, or with four or more layers to permit smaller incremental changes in shielding efficiency. Although radial symmetry is preferred (so as to promote homogeneity of the plasma inside the chamber), implementations of the invention according to this embodiment are not limited to the specific shapes (e.g., spoke-shaped, pie-slice shaped) that have been described. The number and relative size of the radial members illustrated is not a critical aspect of the invention. For example, the radial members 1152 of the bottom segment 1150 may be configured having varying lengths (e.g., alternating long and short).

Figure 12:
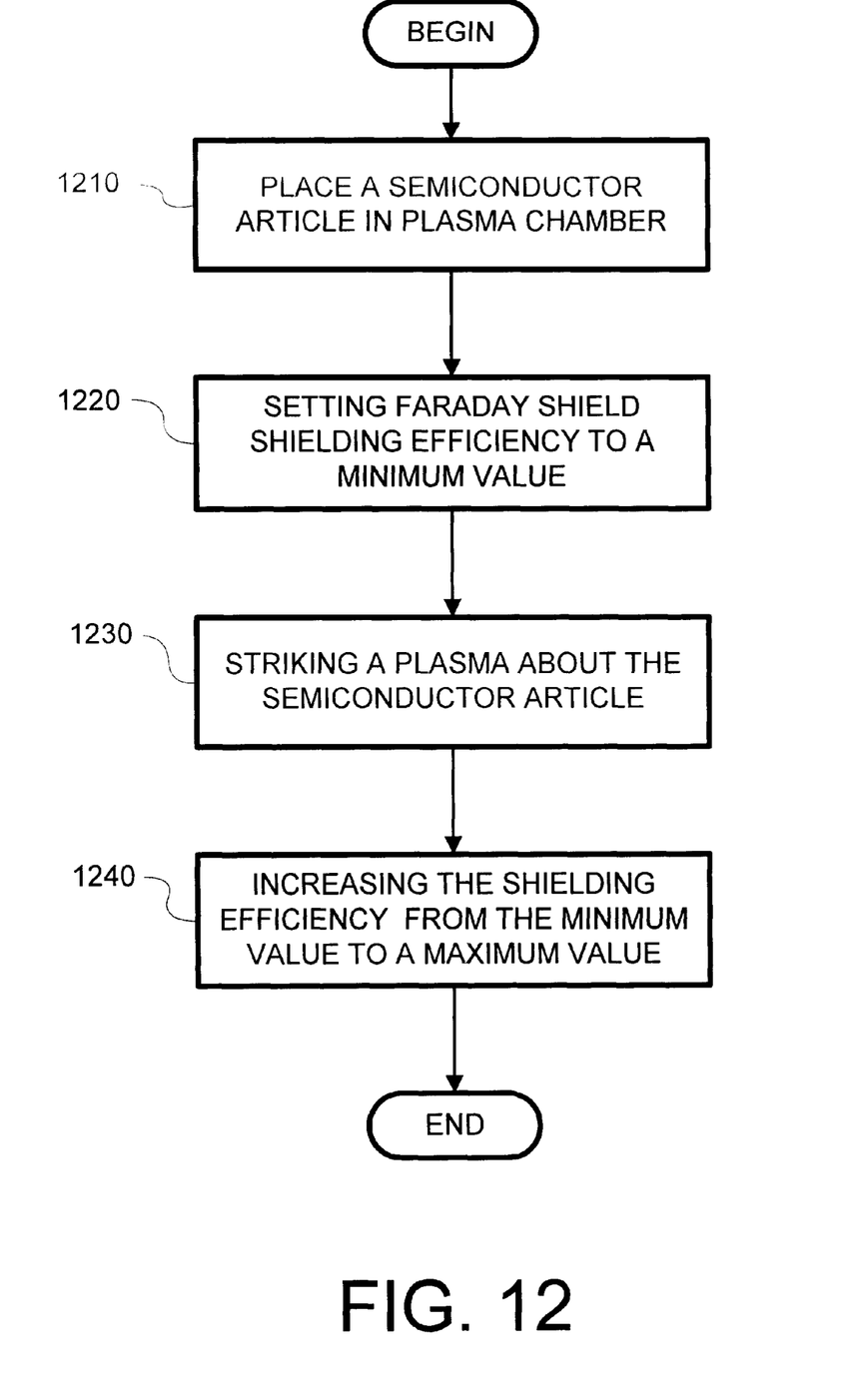
FIG. 12 illustrates a method of etching a semiconductor article according to an embodiment of the present invention.
Figure 13:
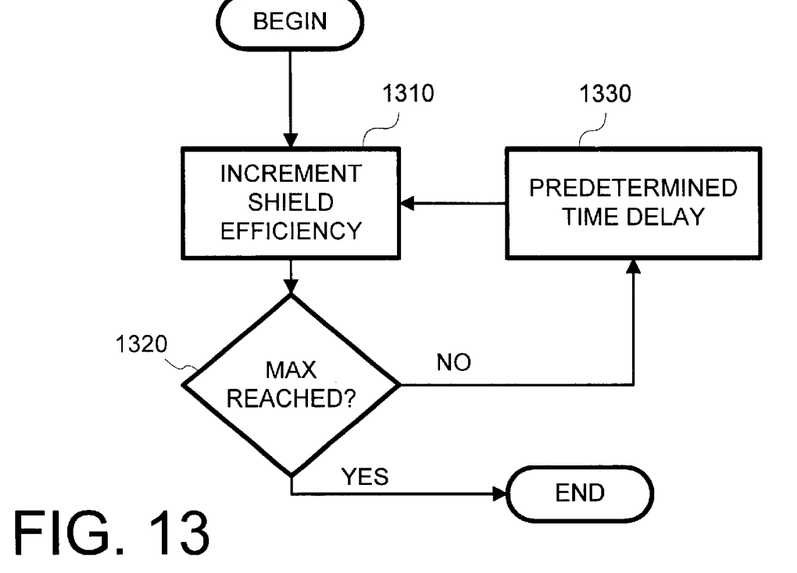
FIG. 13 illustrates a method of increasing shielding efficiency according to one alternate embodiment of the present invention.
Figure 14:
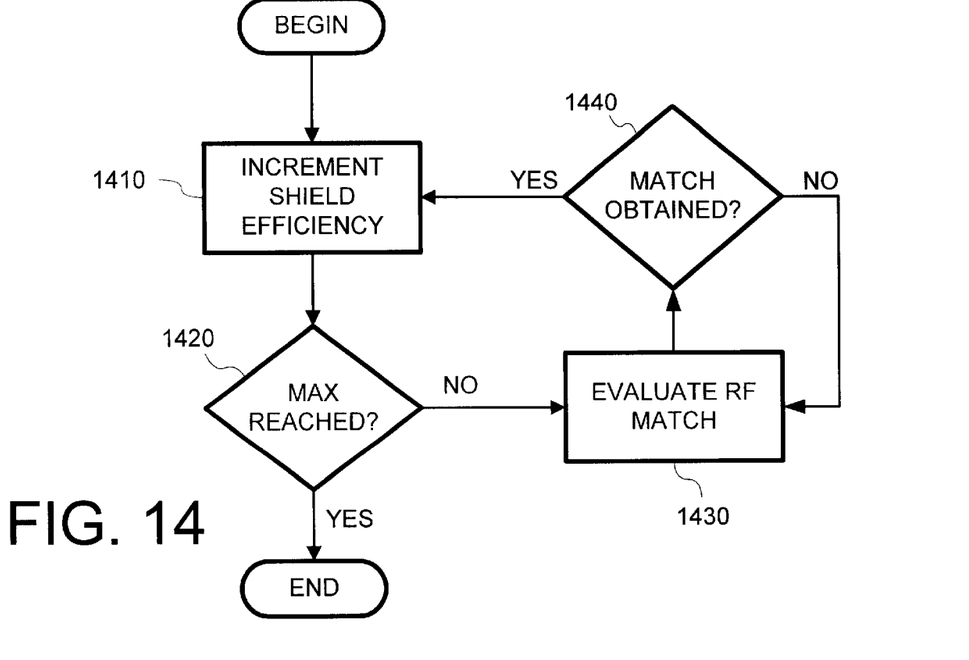
FIG. 14 illustrates a method of increasing shielding efficiency according to another alternate embodiment of the present invention.

Process aspects of the present invention are illustrated via FIGS. 12 to 14.

Referring to FIG. 12, after a workpiece (i.e., a semiconductor wafer) is placed in the plasma chamber 1210, the system controller provides signals such that in the plasma strike phase 1230 of a process, all shield elements are ungrounded (i.e., floating) 1220. Immediately after plasma strike 1230, and with successfull match tuning to minimal reflected power, the shield controller begins to ground the shield segments 1240, ultimately grounding all the segments to obtain a maximum shield efficiency.

Referring to FIG. 13, the shield segments are grounded by increasing the total number grounded at a predetermined rate. After making an incremental increase in the shield efficiency 1310, no additional increment is made until a predetermined time delay 1330, unless of course, it is determined 1320 that the maximum efficiency (all segments grounded) has been reached.

Referring to FIG. 14, an alternate method for increasing shielding efficiency is illustrated. The shield controller may increase the total number of grounded segments, conditionally, with successful match tuning 1430 gating 1440 the next increase 1410 to the total number grounded 1420.

A Faraday shield embodied according to the present invention is easy to manufacture. The segmented shield lends itself to an implementation that is easily realized with standard manufacturing techniques for flexible circuits with surface mounted electronic components.

In addition to reducing wear on chamber components, an additional advantage of the present invention is that it reduces the amount of on-wafer and on-chamber contamination by reducing the rate of sputtering of certain ceramic chamber surfaces.

Furthermore, the present invention reduces the rate of sputtering in a controllable manner after plasma strike has been successfully executed. Reduction is accomplished by incrementally and rapidly grounding successively more elements of an optimized, segmented, Faraday shield design, until the entire shield is grounded. The Faraday shield has maximum shielding efficiency when entirely grounded. Alternatively, the shielding efficiency is increased by reducing the impedance to ground for the segments, until the segments are virtually grounded.

A variable efficiency shield offers significant advantages over fixed designs, by offering a method of varying the capacitive component of coupling from the antenna to the plasma, and accommodating a wide range of plasma conditions without a redesign to the existing RF hardware.

The "pie shaped" configuration of the shield segments is not essential to the practice of the invention, nor is the number of segments disclosed, nor are the grouping or platoon patterns. The number and geometric configuration of the shielding segments are preferably chosen so as to provide optimum shielding performance based on the shape of the plasma reactor for which the shield is being tailored. The useful aspects and advantages of the present invention may be extended to any geometry to work with a plasma reactor of any size, shape, or configuration.

The present invention has been described in terms of preferred embodiments, however, it will be appreciated that various modifications and improvements may be made to the described embodiments without departing from the scope of the invention.

What is claimed is:

1. A shield for providing electrical shielding at a variable efficiency, the shield comprising:
    a common node;
    plural shield segments spaced apart from one another and grouped together in plural platoons;
    plural switches, each of the plural switches being connected between the common node and a respective one of the plural shield segments, so that closure of the switch connects its respective one of the plural shield segments to the common node; and
    multiplexing circuitry connected to each of the plural switches to control opening and closing of the switches such that one shield segment in each of the plural platoons is connected to the common node at the same time.

2. The shield of claim 1, wherein each of the plural switches is indirectly connected to the common node via an impedance element, so that closure of each switch connects its respective one of the plural shield segments to the common node via the impedance element.

3. The shield of wherein the plural shield segments are arranged radially in a "pie slice" configuration.

4. The shield of claim 3, wherein the common node extends circumferentially about the radially-arranged plural shield segments.

5. A shielding system for providing electrical shielding at a variable efficiency, the shielding system comprising:
    a shield; and
    a control interface connected to the shield;
    wherein the shield comprises:
        a common node;
        plural shield segments spaced apart from one another and grouped together in plural platoons;
        plural switches, each of the plural switches being connected between the common node and a respective one of the plural shield segments, so that closure of the switch connects its respective one of the plural shield segments to the common node; and
        multiplexing circuitry connected to each of the plural switches to control opening and closing of the switches such that one shield segment in each of the plural platoons is connected to the common node at the same time; and
    wherein the control interface comprises:
        a ground circuit connecting the common node to ground potential; and
        an incremental command circuit connected to each of the plural switches and generating command signals to selectively close the plural switches based upon occurrence of one or more conditions precedent.

6. The shielding system of claim 5, wherein the conditions precedent include predetermined time intervals.

7. The shielding system of claim 5, wherein the conditions precedent include a determination that an RF matching network providing power to generate and maintain a plasma has optimal power coupling to the plasma.

8. The shielding system of claim 5, wherein the command signals generated by the incremental command circuit close selected ones of the plural switches so as to cause a progressively increasing portion of the plural shield segments to be connected to ground potential via the common node.

* * * * *